US012015262B2

(12) United States Patent
Li et al.

(10) Patent No.: US 12,015,262 B2
(45) Date of Patent: Jun. 18, 2024

(54) INTEGRATOR FOR PROTECTIVE RELAY

(71) Applicant: Accuenergy (Canada) Inc., Toronto (CA)

(72) Inventors: Ketao Li, Toronto (CA); Yufan Wang, Toronto (CA); Liang Wang, Toronto (CA)

(73) Assignee: Accuenergy (Canada) Inc. (CA)

(*) Notice: Subject to any disclaimer, the term of this patent is extended or adjusted under 35 U.S.C. 154(b) by 19 days.

(21) Appl. No.: 17/836,982

(22) Filed: Jun. 9, 2022

(65) Prior Publication Data

US 2023/0402832 A1  Dec. 14, 2023

(51) Int. Cl.
*H02H 3/08* (2006.01)
*H02H 3/10* (2006.01)
*H05K 7/20* (2006.01)

(52) U.S. Cl.
CPC ............. *H02H 3/085* (2013.01); *H02H 3/10* (2013.01); *H05K 7/20409* (2013.01)

(58) Field of Classification Search
CPC .. H05K 7/00–2099; H02H 3/10; H02H 3/085; H02H 5/04–048; G01R 15/181
See application file for complete search history.

(56) References Cited

U.S. PATENT DOCUMENTS

| | | | | |
|---|---|---|---|---|
| 4,635,709 A * | 1/1987 | Altoz | ................ | H05K 7/20254 165/44 |
| 8,264,215 B1 * | 9/2012 | Kovach | ................ | H02G 13/60 324/555 |
| 9,588,147 B2 * | 3/2017 | Vos | ...................... | G01R 15/181 |
| 2004/0105522 A1 | 6/2004 | Kriel et al. | | |

OTHER PUBLICATIONS

Heat sink design facts & guidelines for thermal analysis. Technical brief by wakefield-vette. Retrieved Jul. 6, 2022 from https://www.digikey.com/Site/Global/Layouts/DownloadPdf.ashx?pdfUrl=F51974C9A6D544F1A7D8F119514B67FF.

* cited by examiner

*Primary Examiner* — Jared Fureman
*Assistant Examiner* — Christopher J Clark
(74) *Attorney, Agent, or Firm* — Dhiraj Jindal; PATENT YOGI LLC

(57) ABSTRACT

An integrator for monitoring at least one parameter of an electrical signal in an electrical conductor in protective relay application. The integrator includes an integrator circuit having an input for receiving a signal from a current sensor coupled to the electrical conductor. A switch circuit has an input coupled to the output of the integrator circuit, wherein the switch circuit is controlled by the output of a temperature detection circuit. A power stage circuit has an input coupled to the output of the switch circuit, wherein the temperature detection circuit is coupled to a heating element of the power stage circuit through a temperature sensor, and the heating element is attached to a channel-shaped heatsink for heat dissipation.

15 Claims, 7 Drawing Sheets

500

600

INTEGRATOR FOR PROTECTIVE RELAY

FIELD OF THE INVENTION

The present disclosure generally relates to an integrator for monitoring at least one parameter of an electrical signal in an electrical conductor and, more specifically, to an integrator for protective relay.

BACKGROUND

In electrical engineering, a protective relay device is a relay device designed to trip a circuit breaker when a fault is detected. In prior art, protective relay applications rely on heavy, rigid-body current sensors, resulting in inconvenient installation, especially around large or irregularly shaped conductors.

Flexible current sensors, such as Rogowski coils, could be an option to replace the traditional heavy, rigid-body current sensors in protective relay applications. The output signal of a Rogowski coil needs to be manipulated through an integrator to meet the requirement of a protective relay device, and what's more, the integrator should be kept as small as possible since the limited installation space. When the integrator works in a fault condition, there can be a short duration of transient thermal behavior such as an instantaneous power increase. However, the purpose of a traditional heatsink which is used to disperse heat of the integrator is to maximize the thermal dissipation by optimizing the contact surface with the ambient air. The traditional heatsink doesn't have the ideal heat dissipation result during a transient thermal behavior in a small size integrator.

Therefore, further improvements to thermal management of the integrator would be desirable.

SUMMARY OF THE INVENTION

The embodiments of the present disclosure generally relate to an integrator for monitoring at least one parameter of an electrical signal in an electrical conductor comprising an integrator circuit having an input for receiving a signal from a current sensor coupled to the electrical conductor, a switch circuit having an input coupled to the output of the integrator circuit, wherein the switch circuit is controlled by the output of a temperature detection circuit, and a power stage circuit having an input coupled to the output of the switch circuit, wherein the temperature detection circuit is coupled to a heating element of the power stage circuit through a temperature sensor, and the heating element is attached to a channel-shaped heatsink for heat dissipation.

In some embodiments of the integrator, the temperature detection circuit triggers the switch circuit to isolate the power stage circuit from the integrator circuit when the power stage circuit works above a first threshold temperature. In some embodiments, the temperature detection circuit triggers the switch circuit to conduct electricity from the integrator circuit to the power stage circuit when the power stage circuit works below a second threshold temperature. In some embodiments, the gap between the first threshold temperature and the second threshold temperature is 25° C. In some embodiments, the first threshold temperature is 125° C. and the second threshold temperature is 100° C. In some embodiments, the heatsink has substantially equal width and length. In some embodiments, the current sensor comprises a Rogowski coil.

The embodiments of the present disclosure generally relate to a protective relay system comprising a current sensor located proximate a current conductor for detecting current in the conductor and an integrator coupled to the current sensor. The integrator coupled to the current sensor comprising an integrator circuit having an input for receiving a signal from a current sensor coupled to the electrical conductor, a switch circuit having an input coupled to the output of the integrator circuit, wherein the switch circuit is controlled by the output of a temperature detection circuit, and a power stage circuit having an input coupled to the output of the switch circuit, wherein the temperature detection circuit is coupled to a heating element of the power stage circuit through a temperature sensor, and the heating element is attached to a heatsink with substantially equal width and length.

In some embodiments of the protective relay system, the current sensor comprises a Rogowski coil. In some embodiments, the temperature detection circuit triggers the switch circuit to isolate the power stage circuit from the integrator circuit when the power stage circuit works above a third threshold temperature. In some embodiments, the temperature detection circuit triggers the switch circuit to conduct electricity from the integrator circuit to the power stage circuit when the power stage circuit works below a fourth threshold temperature. In some embodiments, the gap between the third threshold temperature and the fourth threshold temperature is 25° C. In some embodiments, the third threshold temperature is 125° C. and the fourth threshold temperature is 100° C. In some embodiments, the heatsink is made from copper. In some embodiments, the heatsink is channel-shaped.

In some other embodiments, the present disclosure provides a method of thermal management in an integrator having a power stage circuit including a heating element attached to a heatsink for heat dissipation, which method includes the step of restricting the temperature variation of the heatsink as a result of increasing the thermal inertia of the heatsink.

These and other features and aspects of the present disclosure can become fully apparent from the following detailed description of exemplary embodiments, the appended claims, and the accompanying drawings.

DETAILED DESCRIPTION

Embodiments of the present disclosure can be described herein with reference to the accompanying drawings. In the following descriptions, well-known functions or constructions are not described in detail to avoid obscuring the present disclosure. The word "exemplary" is used herein to mean "serving as an example." Any configuration or design described herein as "exemplary" is not to be constructed as preferred, or advantageous, over other configurations or designs. Herein the phrase "coupled" is defined as "directly connected to or indirectly connected with" one or more intermediate components. Such intermediate components may include both hardware and software-based components.

It is further noted that, unless otherwise indicated, all functions described herein may be implemented in either software, hardware, or some combination thereof.

It should be recognized that the present disclosure can be performed in numerous ways, including as a process, an apparatus, a system, a method, or a computer-readable medium such as a computer storage medium.

As used herein, Intelligent Electronic Devices ("IEDs") can be any device that senses electrical parameters and computes data including, but not limited to, Programmable Logic Controllers ("PLCs"), Remote Terminal Units ("RTUs"), electrical power meters, protective relays, fault recorders, phase measurement units, and other devices which are coupled with power distribution networks to control and manage the distribution or consumption of electrical power.

Figure 1:
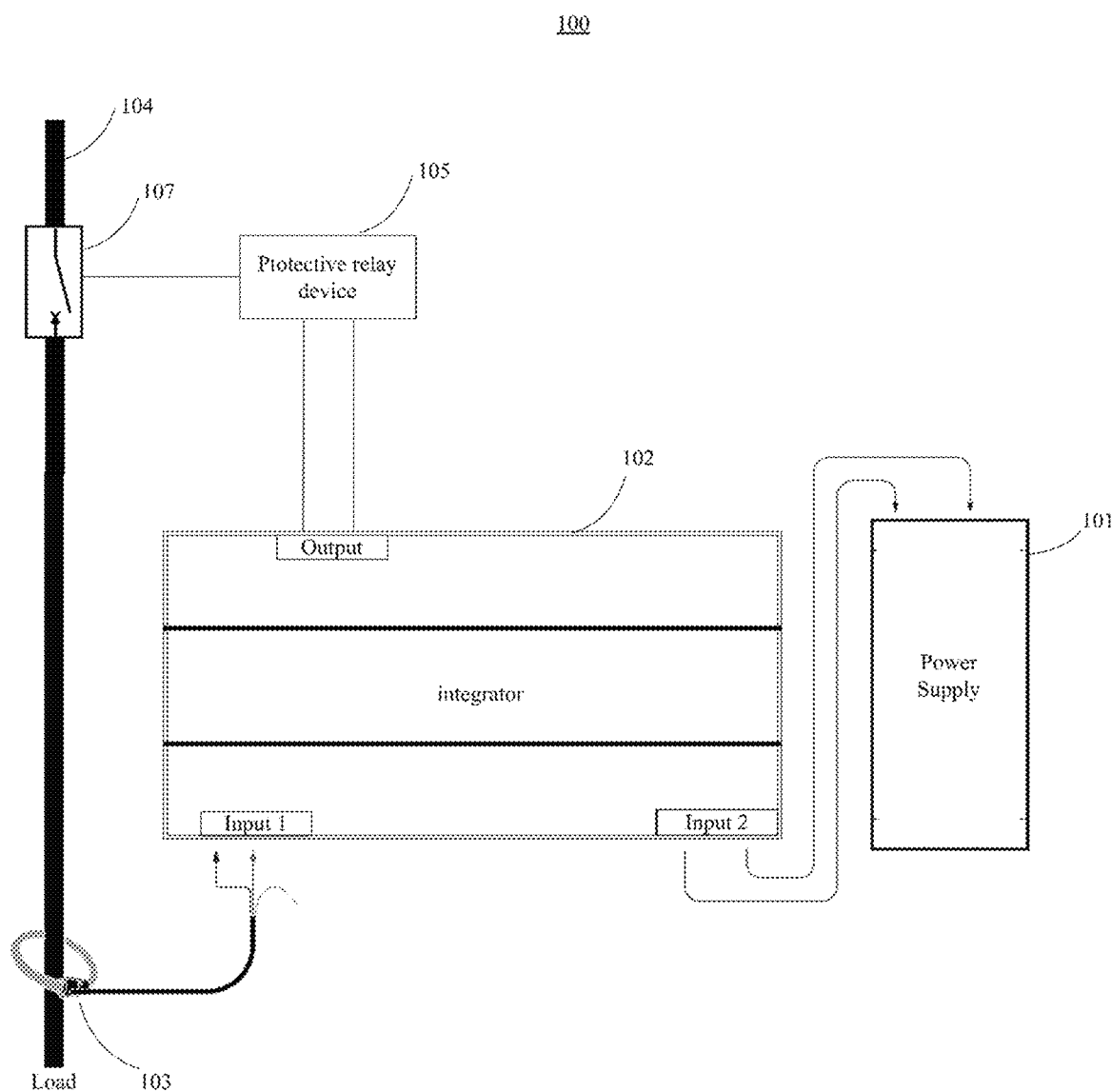
FIG. 1 is a schematic diagram of a protective relay system for safeguarding sensitive electrical equipment in electric power systems.

FIG. 1 is a schematic diagram of an example protective relay system 100 for safeguarding sensitive electrical equipment in electric power systems. The protective relay system 100 can include a power supply 101, an integrator 102, a power distribution line 104 coupled with a Rogowski coil 103, a protective relay device 105, and a circuit breaker 107.

The power supply 101 can provide power to the integrator 102. In one embodiment, the power supply 101 can include a transformer with its primary windings coupled to the power distribution line 104 to provide DC power generated by an AC-DC converter coupled to its secondary windings. In another embodiment, the power supply 101 may provide power to the integrator 102 from an independent power source (e.g., batteries).

The protective relay device 105 can be an intelligent device found in electric power systems that may be responsible for safeguarding sensitive electrical equipment powered by the power distribution line 104, such as motors, transformers, transmission lines, or generators from abnormal power conditions. It can receive input from the integrator 102 and compares the incoming values to a set value (trip value) to detect when a fault has occurred. In response, the circuit breaker 107 coupled with the protective relay device 105 can be tripped to isolate the fault from the rest of the system and prevent damage.

The Rogowski coil 103 can be a flexible current sensor, which may be an electrical device for measuring alternating current (AC) or high-speed current pulses and may sometimes consist of a helical coil of wire with the lead from one end returning through the center of the coil to the other end so that both terminals can be at the same end of the coif. Since the voltage that can be induced in the coil may be proportional to the rate of change (derivative) of current in the straight conductor, the output of the Rogowski coil 103 may usually be connected to an electrical (or electronic) integrator circuit (e.g., integrator circuit 202 in FIG. 2) to provide an output signal that can be proportional to the current.

The integrator 102 can receive an electrical signal from the Rogowski coil 103 and output a specified rated electrical signal to the protective delay device 105. In one embodiment, the integrator 102 can be rated for class 5P20 (TEC 61869-2). This can mean that, if the primary current is around 20 times the rated primary current of the power distribution line 104 in a fault condition, it can be able to sense and measure the current with an accuracy of 5%. In one embodiment, the integrator 102 should be capable to work for a specified duration (e.g., 4 seconds) in the fault condition.

In another embodiment, the integrator 102 can output the specified rated electrical signal to other IEDs such as a power meter.

The power distribution line 104 may be one kind of electrical conductor.

Figure 2:
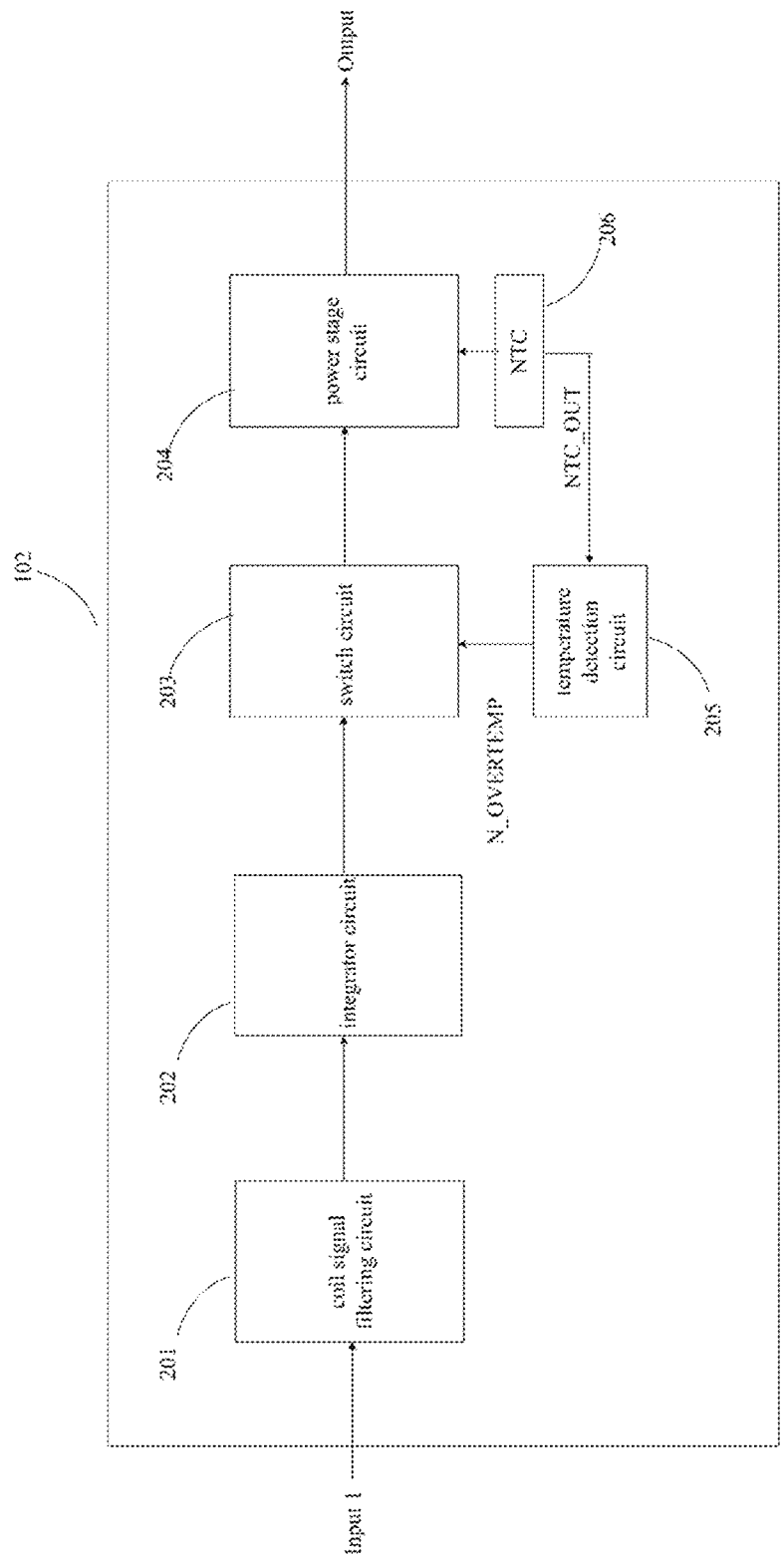
FIG. 2 is a block diagram of an integrator for monitoring the current in the power distribution line in accordance with one embodiment of the disclosure.

The example of FIG. 2 is a block diagram of the integrator 102 for monitoring the current in the power distribution line 104. The integrator 102 can include a coil signal filtering circuit 201, an integrator circuit 202, a switch circuit 203, a temperature detection circuit 205, a power stage circuit 204 and a NTC thermistor circuit 206.

The coil signal filtering circuit 201 can receive electrical signals from the Rogowski coil 103 and passes the specified signal among the electrical signals according to different applications. It should be noted that the coil signal filtering circuit 201 can be an optional component of the integrator 102.

Since the voltage that can be induced in the Rogowski coil 103 may be proportional to the rate of change (derivative) of a current in the power distribution line 104, the output of the Rogowski coil 103 can usually be connected to an integrator circuit 202 to provide an output signal that can be proportional to the current. The integrator circuit 202 may be implemented by the prior art such as U.S. Pat. No. 9,588,147 entitled "Electronic integrator for Rogowski coil sensors" filed on Feb. 4, 2016.

The switch circuit 203 can be used to control the signal path between the integrator circuit 202 and the power stage circuit 204. A signal N_OVERTEMP from the temperature detection circuit 205 can be used to control the switch circuit 203. In one embodiment, the signal N_OVERTEMP with a low voltage may switch off the switch circuit 203 when the power stage circuit 204 can reach in an overtemperature state. Then the Rogowski coil integrator circuit 202 may be isolated from the power stage circuit 204. The signal N_OVERTEMP with a high voltage may switch on the switch circuit 203 when the power stage circuit 204 can reach in a normal temperature state from the overtemperature state. Then the output of the Rogowski coil integrator circuit 202 can pass to the power stage circuit 204 through the switch circuit 203.

The signal NTC_OUT can be the output of an NTC (Negative Thermal Coefficient) thermistor 206, which can be used as a temperature sensor for power stage circuit 204. The temperature detection circuit 205 can be used to output the signal N_OVERTEMP to control the switch circuit 203 according to the signal NTC_OUT. For example, the NTC thermistor 206 can be NTCALUG39 A103GC by Vishay.

The power stage circuit 204 can perform the basic power conversion from the input voltage to the output voltage and can provide signal to the protective relay device 205. In one embodiment, the power stage circuit 204 can include two power MOSFETs (Metal-Oxide Semiconductor Field-Effect Transistors). For example, the MOSFETs may be a N-Channel PSMN2R5-60PL by Nexperia and a P-Channel SQP120P06-6m7L by Vishay Siliconix. Since the MOSFETs can be the main heating element of the integrator 102, the NTC thermistor 206 can be coupled to the MOSFETs for temperature detection.

Figure 3:
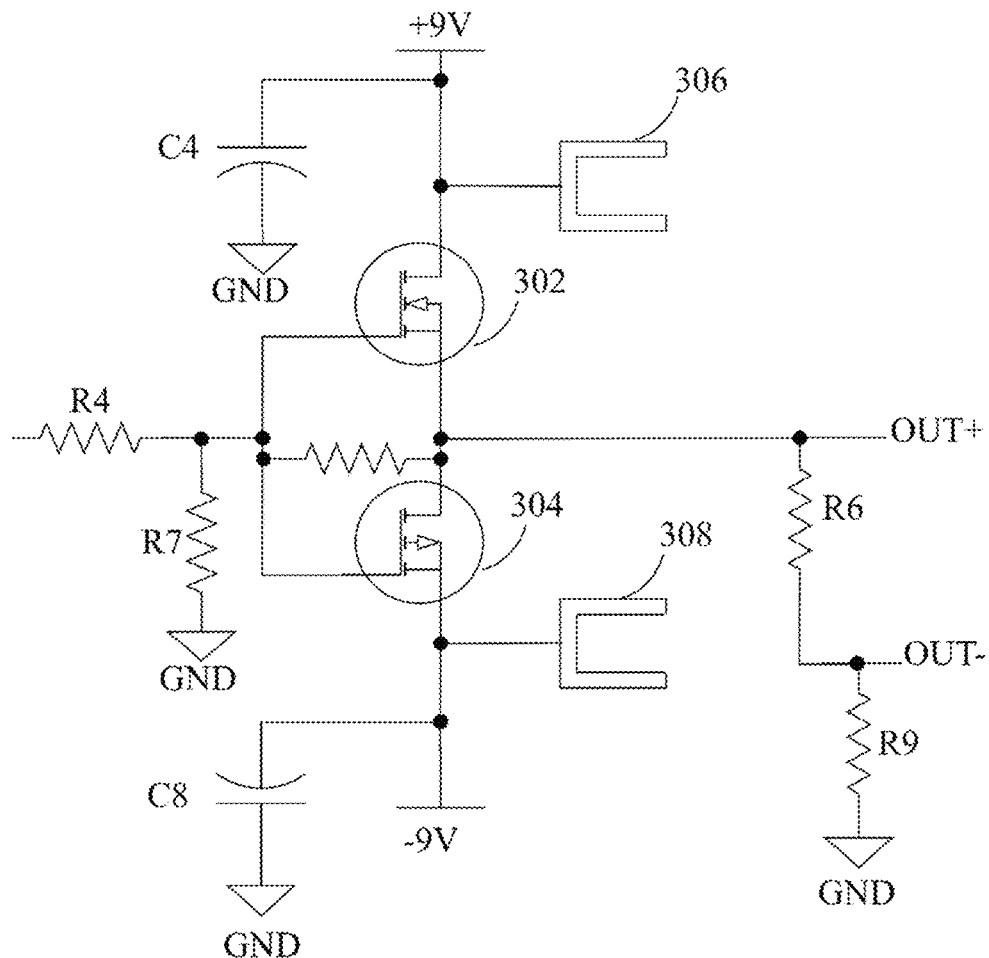
FIG. 3 is a schematic diagram of a power stage circuit in accordance with one embodiment of the disclosure.

The example of FIG. 3 is a schematic diagram of the power stage circuit 204. The power stage circuit 204 can include two MOSFETs (302 & 304). A heatsink 306 can be attached to the MOSFET 302 (e.g., PSMN2R5-60PL) for dissipating heat. Another heatsink 308 can be attached to the MOSFET 304 (e.g., SQP120P06-6m7L) for dissipating heat. In one embodiment, the NTC thermistor 206's lug can be mounted on the surface of P-channel MOSFET 304. In another embodiment, the NTC thermistor 206's lug can be mounted on the surface of N-channel MOSFET 306.

In one embodiment, the integrator 102 can be rated for class 5P20 (IEC 61869-2). This can mean that if the primary current can be 20 times the rated primary current of the power distribution line 104, it can be able to sense and measure the current with an accuracy of 5%. In another embodiment, the integrator 102 rated 1 A may have the ability of driving 20 A for a minimum duration of 4 seconds in case of a fault condition. Given that the minimum burden of the integrator 102 can be 1 mΩ and the integrator 102 can be rated 1 A, the MOSFET power dissipation can be 4 Watts when the integrator 102 can work in the nominal current 1 A according to a simulation result. However, the MOSFET power dissipation can be 74.5 Watts when the integrator 102 can work in the fault current (20 A) according to a simulation result. Therefore, a heatsink may be needed to dissipate heat from MOSFET.

In prior art, the design principle for a heatsink can allow to maximize the thermal dissipation by optimizing contact surface with the ambient air. However, given transient thermal behavior (e.g., 4 seconds), increasing the thermal inertia of the heatsink rather than its contact surface would get better dissipation results. The thermal inertia can reflect the degree of slowness with which the temperature of a body can approach that of its surroundings and which can be dependent upon its absorptivity, its specific heat, its thermal conductivity, its dimensions, and other factors.

Figure 4:
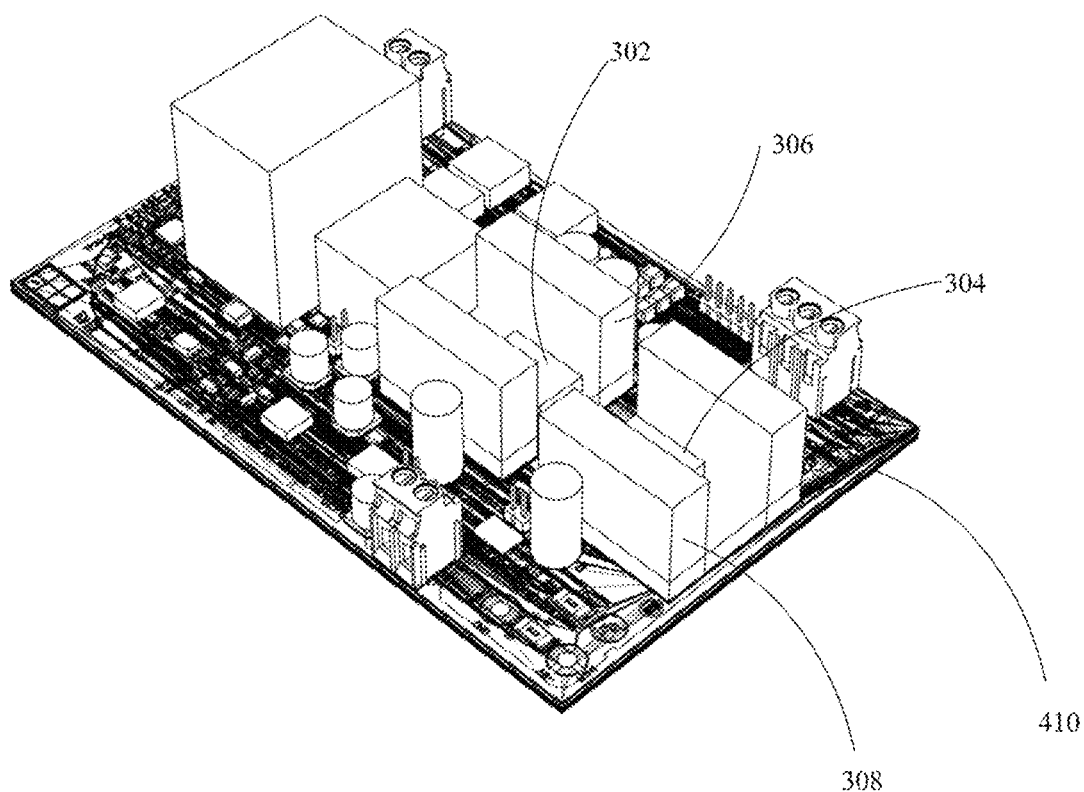
FIG. 4 is a perspective front view of a PCBA of an integrator in accordance with one embodiment of the disclosure.

In the example of FIG. 4 is a perspective front view of a PCBA 400 (Printed Circuit Board Assembly) of an integrator in accordance with one embodiment of the disclosure. The MOSFET 302 may be disposed on the top surface in the central section of the heatsink 306. The MOSFET 304 can be disposed on the top surface in the central section of the heatsink 308. The heatsinks 306 and 308 may be disposed on the top surface of the PCB board 410. In one embodiment, the NTC thermistor 206's lug ring may be mounted on the top surface of the MOSFET 302 or MOSFET 304.

In one embodiment, a thermal paste may be applied between the MOSFET 304 and heatsink 308 to enhance the heat transfer. In another embodiment, a thermal paste can be applied between the PCB board 410 and heatsink 308 to enhance the heat transfer. Similarly, a thermal paste can be applied between the MOSFET 302 and heatsink 306. Another thermal paste can be applied between the PCB board 410 and heatsink 306.

Different from the traditional heatsink shaped like fins, the custom heatsinks 302 or heatsink 304 may be shaped like a channel. The traditional heatsink can provide a large surface area for the heat to dissipate throughout the rest of electrical device. If such a traditional heatsink can be encapsulated in an enclosure having a limited natural airflow through the enclosure vents, the ambient temperature in the enclosure can increase quickly and the heat in the enclosure cannot be dissipated to the outside of the enclosure timely.

The custom heatsinks 302 or 304 shaped like a channel increase their volume. Then, the thermal inertia of the custom heatsink can be increased. If such custom heatsinks are encapsulated in an enclosure having a limited natural airflow through the enclosure vents, the ambient temperature in the enclosure can increase much slower and the heat in the enclosure can be dissipated to the outside of the enclosure timely.

It should be recognized that the channel-shaped heatsink may be just one kind of custom heatsink with a higher thermal inertia than the traditional heatsink. There can be many other ways to increase the thermal inertia of the heatsink.

Figure 5:
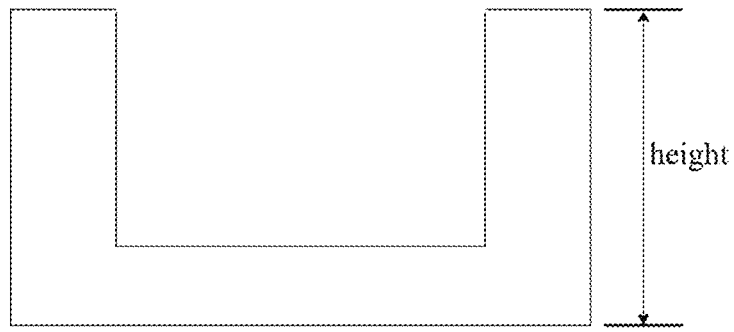
FIG. 5 is a front plan view of a custom heatsink in accordance with one embodiment of the disclosure.

The example of FIG. 5 is a front plan view of a custom heatsink 500 in accordance with one embodiment of the disclosure. The custom heatsink 500 may be one of heatsink 306 and heatsink 308. For example, the height of the custom heatsink may be 22 min.

Figure 6:
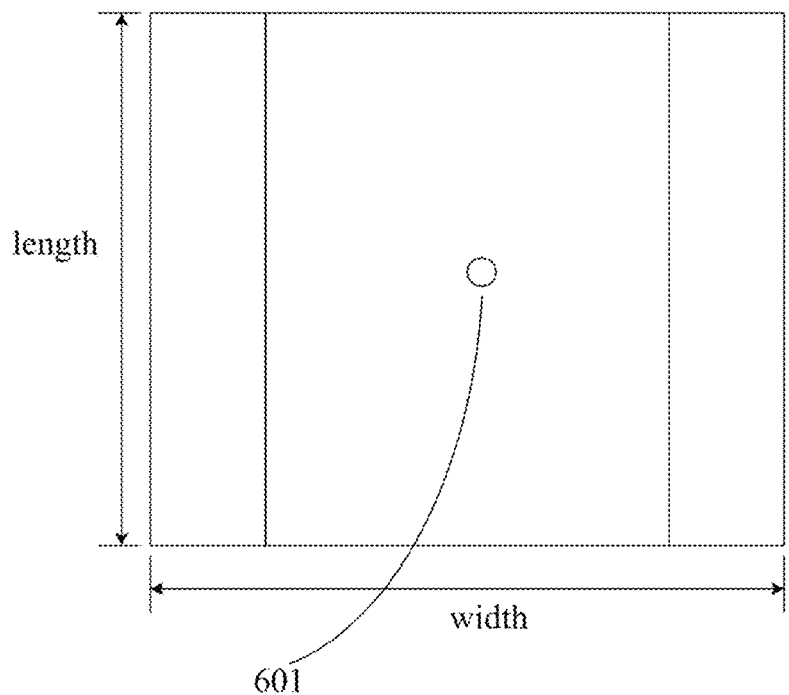
FIG. 6 is a top plan view of a custom heatsink in accordance with one embodiment of the disclosure.

The example of FIG. 6 is a top plan view of a custom heatsink 600 in accordance with one embodiment of the disclosure. The custom heatsink 600 may be one of heatsink 306 and heatsink 308. When the length of the custom heatsink 306 or 308 may be substantially the same as its width, there would be a better heat dissipation performance in the integrator. In the central section of the integrator 102, there can be a via hole 601 through which the lug of NTC thermistor 206 can be fastened with the MOSFET 302 or 304 using a bolt.

Figure 7:
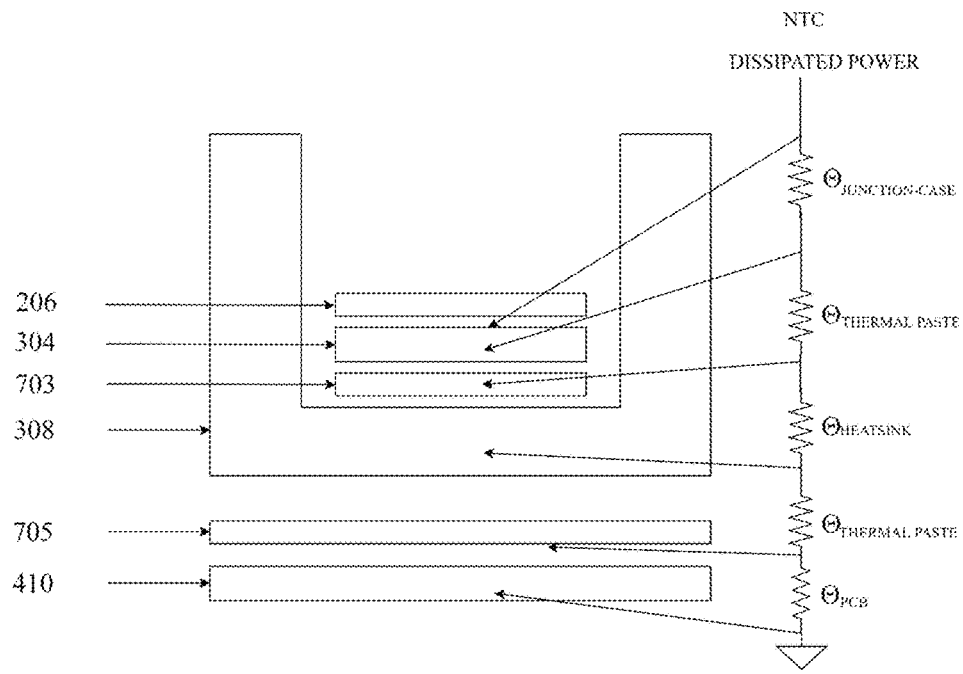
FIG. 7 is thermal model of a MOSFET assembly in accordance with one embodiment of the disclosure.

The example of FIG. 7 can be thermal model of a MOSFET assembly in accordance with one embodiment of the disclosure. FIG. 7 can illustrate how the heat flows in the MOSFET assembly. The MOSFET assembly can include a NTC 206, the MOSFET 304, a thermal paste 703, the heatsink 308, a thermal paste 705, and the PCB board 410.

The thermal resistance from the MOSFET 304 junction to the ambient air (junction-to-ambient) $\Theta_{TH-JA}$ can be calculated as follows:

$$\Theta_{TH-JA} = \Theta_{JUNCTION-CASE} + \Theta_{THERMAL\ PASTE} + \Theta_{HEATSINK} + \Theta_{THERMAL\ PASTE} + \Theta_{PCB},$$

where $\Theta_{JUNCTION-CASE}$ can be the thermal resistance junction to case (° C./W), $\Theta_{THERMAL\ PASTE}$ can be the thermal resistance of the thermal paste (° C./W), $\Theta_{HEATSINK}$ can be the thermal resistance of the heatsink (° CM), and $\Theta_{PCB}$ can be the thermal resistance of the PCB (° C./W).

It should be noted that the MOSFET 302 can make up another MOSFET assembly similar to FIG. 7.

Figure 8:
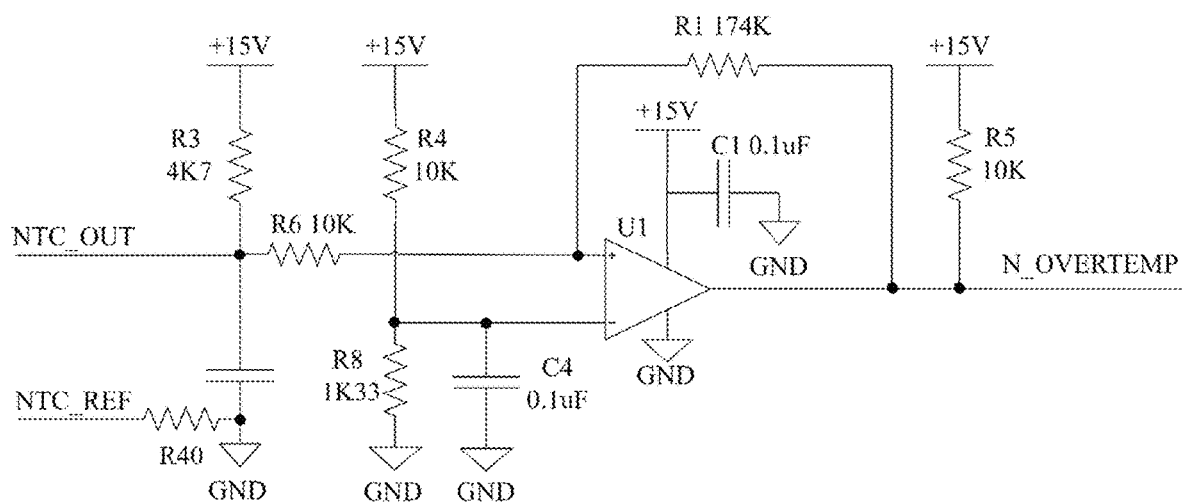
FIG. 8 is a schematic diagram of an example temperature detection circuit.

The example of FIG. 8 is a schematic diagram of an example temperature detection circuit 205. The signal NTC_OUT can be the output of an NTC thermistor 206, which can be used as a temperature sensor for the power stage circuit 204. The signal NTC_REF may be a reference voltage. The NTC thermistor 206 can be made from a material that experiences a decrease in electrical resistance when its temperature is raised. The NTC thermistor 206 can be attached to the MOSFET 302 or 304 for the temperature detection of the MOSFET.

The NTC thermistor 206 can make a resistive voltage divider with the resistor R3 (4.7K). By using a voltage comparator (U1), a ratiometric comparison can be made with a reference voltage of about 1.8V. The temperature detection circuit 205 can integrate a hysteresis through the resistor R1 (174K) to avoid toggling around the detection threshold. The temperature detection circuit 205 introduces a margin of about 25° C. between the trip temperature and the restart temperature. The trip temperature can be the threshold temperature when the switch circuit 203 can switch off since the power stage circuit 204 can work beyond the maximum withstand temperature. The restart temperature can be the threshold temperature when the switch circuit 203 can switch on again after a period of cooling since the power stage circuit 204 can work in an acceptable temperature. It's observed that the margin of about 25° C. between the trip temperature and the restart temperature would get a better heat dissipation performance for the integrator 102.

Figure 9:
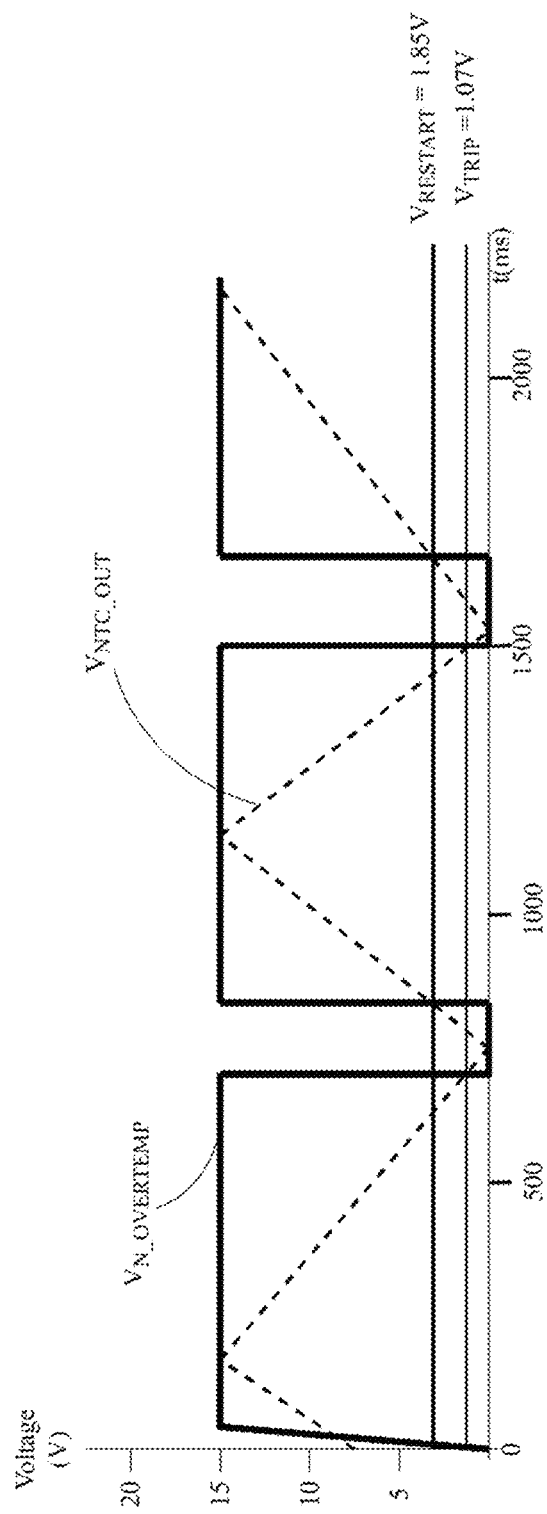
FIG. 9 is a diagram of example waveforms illustrating the relationship between the voltage $V_{N\_OVERTEMP}$ and $V_{NTC\_OUT}$.

FIG. 9 is a diagram of example waveforms illustrating the relationship between the voltage $V_{N\_OVERTEMP}$ and $V_{NTC\_OUT}$. $V_{N\_OVERTEMP}$ can be the voltage of signal N_OVERTEMP and $V_{NTC\_OUT}$ can be the voltage of signal NTC_OUT. $V_{TRIP}$ can be the voltage of signal NTC_OUT when the power stage circuit 204 can work beyond the maximum withstand temperature. At this temperature, the switch circuit 203 must be tripped to protect the power stage circuit 204. $V_{RESTART}$ can be the voltage of signal NTC_OUT when the power stage circuit 204 can work in an acceptable temperature after a period of cooling. At this temperature, the switch circuit 203 may switch on again to allow the power stage circuit 204 to continue to work.

When the $V_{NTC\_OUT} \leq V_{TRIP}$ (e.g., 1.07V corresponding to about 125° C.), $V_{N\_OVERTEMP}$ becomes low thus turning the switch circuit 203 ON. In the same way, when the $V_{NTC\_OUT} \geq V_{RESTART}$ (e.g., 1.85V corresponding to about 100° C.), $V_{N\_OVERTEMP}$ becomes high thus turning the switch circuit 203 OFF. In a preferred embodiment, it may be observed that it would get a better heat dissipation performance for the integrator 102 when the trip temperature is of about 125° C. and the restart temperature is of about 100° C.

The exemplary temperatures proposed herein are mere examples for helping a reader understand the proposed apparatuses and may not be limiting in any way since it will be appreciated that the preferred temperatures may vary according to various alternative characteristics the associated components and environment.

The present invention may be tested using consecutive cycles in fault condition. In one of the tests, the heatsink can adopt the channel shape in FIG. 5. In some embodiments, there can be a margin of about 25° C. between the trip temperature and the restart temperature. For example, the trip temperature may be set around 125° C. and the restart temperature can be set at about 100° C. In an embodiment, the ambient temperature can be set at about 75° C. and the minimum burden of the integrator can be set around 1mΩ.

Table 1 illustrates the performance of an embodiment of the integrator during a stress test. TON can be the duration when the switch circuit may be ON. TOFF can be the duration when the switch circuit is OFF.

The integrator can power on with a cold start (the ambient temperature may be of about at around 00:00. The integrator 102 can work for a duration of around 55 seconds (TON). Since the integrator's temperature may be beyond the TRIP temperature that may be of about 125° C., the switch circuit 203 can shut off to protect the integrator 102. For example, after about 58 seconds ($T_{OFF}$), with the integrator 102 cooling off and its temperature reaching below a RESTART temperature that can be of about 100° C., the integrator 102 can restart at a given time (e.g., 01:53). And then the cycle can continue for many times.

In the embodiment of Table 1, the TON may have a delta time of about 11 seconds after several times. In the industry, the short-time thermal current max duration of the integrator 102 can be around 4 seconds. Therefore, the performance of the integrator 102 can be far better than the industrial index.

TABLE 1

| | Test result | | | |
|---|---|---|---|---|
| Cycle# | $T_{ON}$/$T_{OFF}$ | Time measured(s) | Delta time(s) | Comments |
| 1 (Cold start) | $T_{ON}$ | 00:00 | 00:55 | >4 seconds |
| | $T_{OFF}$ | 00:55 | 00:58 | OK |
| 2 (Hot start) | $T_{ON}$ | 01:53 | 00:11 | >4 seconds |
| | $T_{OFF}$ | 02:04 | 01:12 | OK |
| 3 (Hot start) | $T_{ON}$ | 03:16 | 00:10 | >4 seconds |
| | $T_{OFF}$ | 03:26 | 01:23 | OK |
| 4 (Hot start) | $T_{ON}$ | 04:49 | 00:11 | >4 seconds |
| | $T_{OFF}$ | 05:00 | 01:29 | OK |
| 5 (Hot start) | $T_{ON}$ | 06:29 | 00:11 | >4 seconds |
| | $T_{OFF}$ | 06:40 | 01:36 | OK |
| 6 (Hot start) | $T_{ON}$ | 08:16 | 00:11 | >4 seconds |
| | $T_{OFF}$ | 08:27 | 01:40 | OK |
| 7 (Hot start) | $T_{ON}$ | 10:07 | 00:11 | >4 seconds |
| | $T_{OFF}$ | 10:18 | | OK |

Embodiments of the teachings of the present disclosure have been described in an illustrative manner. It is to be understood that the terminology, which has been used, is intended to be in the nature of words of description rather than of limitation. Many modifications and variations of the embodiments are possible in light of the above teachings. Therefore, within the scope of the appended claims, the embodiments can be practiced other than specifically described.

What is claimed is:

1. An integrator for monitoring at least one parameter of an electrical signal in an electrical conductor, comprising:
    an integrator circuit having an input for receiving a signal from a current sensor coupled to the electrical conductor;
    a switch circuit having an input coupled to the output of the integrator circuit, wherein the switch circuit is controlled by the output of a temperature detection circuit;
    a power stage circuit having an input coupled to the output of the switch circuit, wherein the temperature detection circuit is coupled to a heating element of the power stage circuit through a temperature sensor, and the heating element is attached to a channel-shaped heatsink for heat dissipation.

2. The integrator of claim 1, wherein the temperature detection circuit triggers the switch circuit to isolate the power stage circuit from the integrator circuit when the power stage circuit works above a first threshold temperature.

3. The integrator of claim 2, wherein the temperature detection circuit triggers the switch circuit to conduct electricity from the integrator circuit to the power stage circuit when the power stage circuit works below a second threshold temperature.

4. The integrator of claim 3, wherein gap between the first threshold temperature and the second threshold temperature is 25° C.

5. The integrator of claim 3, wherein the first threshold temperature is 125° C. and the second threshold temperature is 100° ° C.

6. The integrator of claim 1, wherein the heatsink has substantially equal width and length.

7. The integrator of claim 1, wherein the current sensor comprises a Rogowski coil.

8. A protective relay system, comprising:
a current sensor located proximate a current conductor for detecting current in the conductor; and
an integrator coupled to the current sensor, comprising:
an integrator circuit having an input for receiving a signal from a current sensor coupled to the electrical conductor;
a switch circuit having an input coupled to the output of the integrator circuit, wherein the switch circuit is controlled by the output of a temperature detection circuit; and
a power stage circuit having an input coupled to the output of the switch circuit, wherein the temperature detection circuit is coupled to a heating element of the power stage circuit through a temperature sensor, and the heating element is attached to a heatsink with substantially equal width and length.

9. The protective relay system of claim 8, wherein the current sensor comprises a Rogowski coil.

10. The protective relay system of claim 8, wherein the temperature detection circuit triggers the switch circuit to isolate the power stage circuit from the integrator circuit when the power stage circuit works above a third threshold temperature.

11. The protective relay system of claim 10, wherein the temperature detection circuit triggers the switch circuit to conduct electricity from the integrator circuit to the power stage circuit when the power stage circuit works below a fourth threshold temperature.

12. The protective relay system of claim 11, wherein the gap between the third threshold temperature and the fourth threshold temperature is 25° ° C.

13. The protective relay system of claim 11, wherein the third threshold temperature is 125° C. and the fourth threshold temperature is 100° C.

14. The protective relay system of claim 8, the heatsink is made from copper.

15. The protective relay system of claim 8, the heatsink is channel-shaped.

* * * * *